United States Patent [19]

Takagi

[11] Patent Number: 4,774,561

[45] Date of Patent: Sep. 27, 1988

[54] SEMICONDUCTOR DEVICE

[75] Inventor: Hiroshi Takagi, Itami, Japan

[73] Assignee: Mitsubishi Denki Kabushiki Kaisha, Hyogo, Japan

[21] Appl. No.: 866,356

[22] Filed: May 23, 1986

[30] Foreign Application Priority Data

May 23, 1985 [JP] Japan .................. 60-110943

[51] Int. Cl.⁴ ............................ H01L 23/48
[52] U.S. Cl. ..................... 357/65; 357/51; 357/54; 357/84
[58] Field of Search ........... 357/71, 54, 51, 84, 357/65

[56] References Cited

FOREIGN PATENT DOCUMENTS 52-28280  3/1977  Japan ..................... 357/51
60-132344 7/1985  Japan ..................... 357/71

OTHER PUBLICATIONS

D. Smart et al, "Laser Targeting Consideration in Redundant Memory Repair" Proceedings of Spie International Society of Optical Engineering (USA) vol. 385 97-101 1983, p. 4.

M. Shiozaki et al, "Radiation Damage due to Laser Fuse Blowing", ESI Technical Article, p. 5 (proc. 1982 Electrochem Society Annual Meeting).

"A High-Speed Hi-CMOS II 4K Static RAM" IEEE Journal of Solid-State Circuits vol. SC-16 No.5, Oct. 1981, p. 5.

Primary Examiner—Andrew J. James
Assistant Examiner—Gregory A. Key
Attorney, Agent, or Firm—Birch, Stewart, Kolasch & Birch

[57] ABSTRACT

A semiconductor device with a circuit including a fuse wiring which comprises a step portion provided on a first insulating film which is provided on a substrate; a fuse wiring provided on the step portion via a second insulating film so that the central portion of the fuse wiring traverses the step portion; the central portion of the fuse wiring being positioned at a higher position than both the side portions thereof by a distance equal to the thickness of the step portion; and a third insulating film having a flat surface provided on the fuse wiring.

8 Claims, 8 Drawing Sheets

SEMICONDUCTOR DEVICE

FIELD OF THE INVENTION

The present invention relates to a semiconductor device with a circuit including a fuse wiring, and more particularly to a semiconductor device with a redundancy circuit including a fuse for laser trimming.

BACKGROUND OF THE INVENTION

Generally, a circuit for relieving a faulty chip provided inside a semiconductor device is called as a redundancy circuit.

If one or several faulty bits that occur in a production process are included in a memory IC chip, the memory cell rows or columns including the faulty bits can be replaced by auxiliary memory cell rows or columns that include no faulty bits inside the chip. The auxiliary memory cell rows and columns and the replacement circuit together constitute a circuit which is called a redundancy circuit.

In order to replace a memory cell row or column that includes a faulty bit, the following steps are conducted:

(1) The memory cell row or column is separated from the circuit, and (2) an auxiliary memory cell row or column is connected to the circuit to which the faulty row or column has been connected by the replacement circuit.

In the above-described operation, a fuse provided in a redundancy circuit is cut off. That is, (1) a memory cell row or column that includes a faulty bit is separated from the circuit by cutting off the fuse connected to the row or column, and (2) an auxiliary memory cell row or column is connected to the above-mentioned circuit by cutting off a plurality of fuses in a special combination in accordance with a rule, which fuses are provided in the replacement circuit.

A prior art method for producing a semiconductor device with a redundancy circuit will be described with reference to FIGS. 4(a) and 4(b).

Figure 4A:
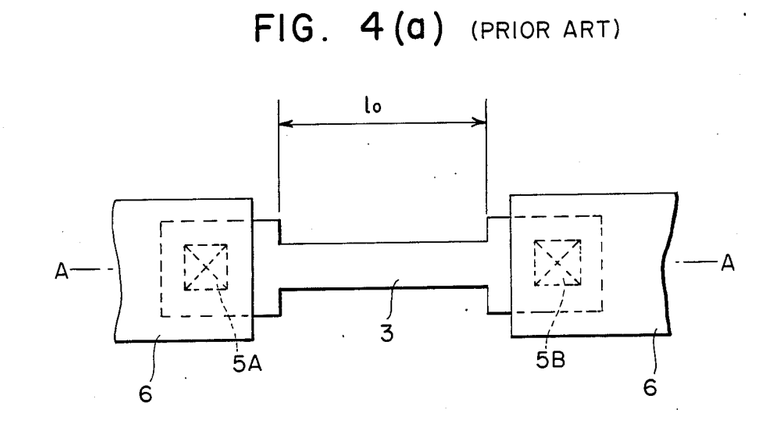
FIG. 4(a) is a plan view showing a prior art method for producing a fuse for a redundancy circuit.
Figure 4B:
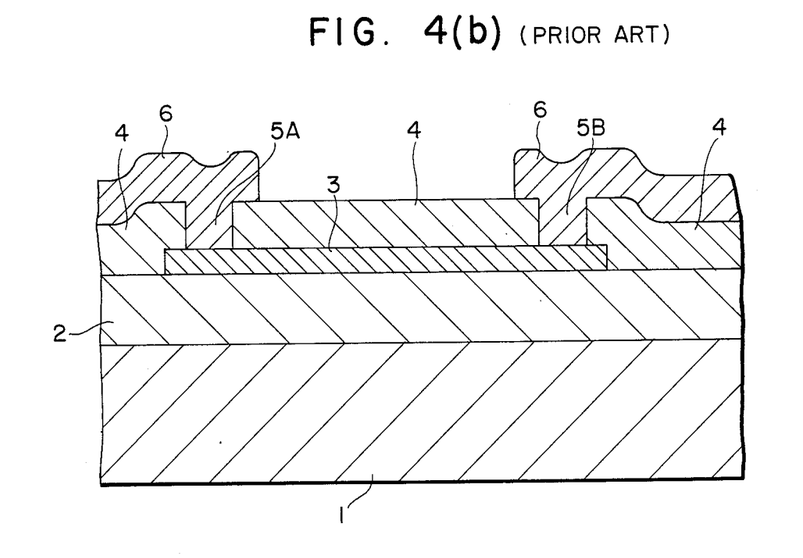
FIG. 4(b) is a cross-sectional view of FIG. 4(a) in lines A to A.

As shown in FIG. 4(b), a field oxide film 2 is produced on a silicon substrate 1, and then a fuse for a redundancy circuit 3 is produced with the same material as the polycrystalline silicon gate, and a PSG (phosphorous silicate glass) film 4 is grown thereon by a CVD (chemical vapour deposition) method. Subsequently, the PSG film 4 is selectively etched using a photoresist mask to expose a portion of the fuse 3, thereby providing contact holes 5A and 5B. Thereafter, Al wiring 6 is produced on the PSG film 4, and a redundancy circuit including the fuse 3 is completed.

The method for cutting off the fuse of this redundancy circuit will be described below.

FIG. 4(a) shows an elevational view of the redundancy circuit fuse 3, and 10 designates a cut off region length, that is, a length of the region which can be cut off.

Figure 5A:
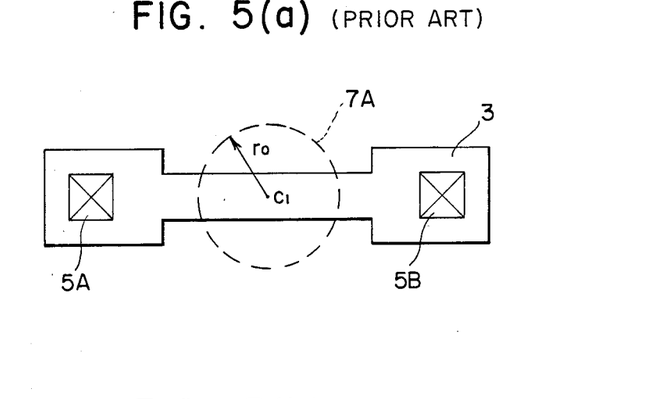
FIGS. 5(a) to (c) are diagrams showing states where a laser beam is irradiated to the redundancy circuit fuse in a prior art method.
Figure 5B:
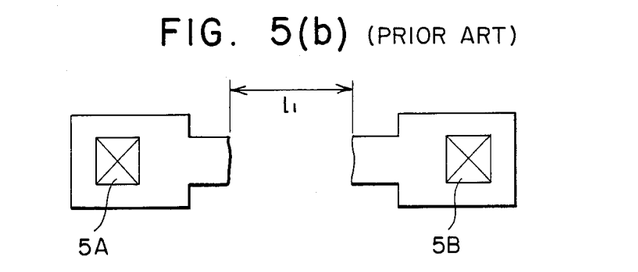

FIG. 5 shows the relationship between the position and the radius of the irradiated laser beam, and the cut off region length 10. FIG. 5(a) shows a state where the laser beam 7A having a beam radius r0 is irradiated to the center C1 of the redundancy circuit fuse 3, and FIG. 5(b) shows a state where the fuse 3 is cut off along the cut off length L1 after the laser beam irradiation.

In this case, the following relationship is established.

$$2r0 = L1 \tag{1-1}$$

Figure 5C:
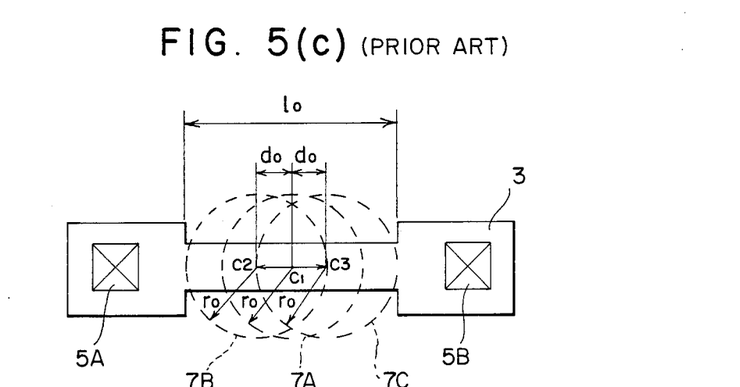

It is supposed that the positional accuracy of the laser beam 7A is within $\pm d0$ and the region of the laser beam irradiation varies within the range of the laser beam from 7B to 7C in accordance with the variation of the irradiation center within the range from C2 to C3, the cut off length L1 including variations is represented by the following formula.

$$L1 = 2r0 + 2d0 \tag{1-2}$$

and $$L1 \leq l0. \tag{1-3}$$

Accordingly, the cut off region length 10 is represented by the following formula.

$$l0 \geq 2(r0 + d0) \tag{1-4}$$

Although, it is secured that $r0 = 2 \ \mu m$, and $d0 = 1.5 \ \mu m$ at present, the minimum value of the cut off region length 10 at using the highest preciseness laser system is represented by the following formula, $$l0 = 2(r0 + d0) = 7 \ \mu m \tag{1-5}$$

and a much shorter cut off region length can not be obtained. Furthermore, there is a disadvantage in that the cut off region length 10 is determined dependent on the preciseness of the laser system.

Another prior art redundancy circuit of a semiconductor device is disclosed in an article by D. Smart, R. Reilly, B. Wells, "Laser Targetting Consideration in Redundant Memory Repair", Proceedings of Spie International Society of Optical Engineering (USA) vol. 385 97–101 1983. This article reports a chip-alignment method used in a laser trimming device of a TERADYNE Co., Ltd., and discloses the principle of laser scanning method. It discloses that the light reflectivity of the polysilicon varies dependent on the thickness of a silicon dioxide film provided on the polysilicon.

Another prior art redundancy circuit of a semiconductor device is reported in an article by M. Shiozaki, S. Marita, K. Hashimoto, K. Hishioka, and H. Nishimura, "Radiation Damage due to Laser Fuse Blowing", ESI Technical Article. In this article the size of a crater after a laser blowing is observed with parameters of thickness and film quality of the passivation film on a laser fuse formed of polysilicon, and a leakage current at the junction in the neighborhood after the laser blowing is measured.

Another prior art redundancy circuit of a semiconductor device is reported in an article by O. Minato, T. Masuhara, T. Sasaki, Y. Sakai, and K. Yoshizaki, "A High-speed Hi-CMOS II 4K Static RAM", IEEE Journal of Solid-State Circuits, vol. SC-16 No. 5 Oct. 1981. This article discloses a method of irradiating a laser beam to non-doped polysilicon so as to make the same short-circuited in a high-efficiency CMOS 4K Static RAM.

SUMMARY OF THE INVENTION

An object of the present invention is to provide an improved semiconductor device with a circuit including a fuse wiring in which the cut off region length of a fuse can be determined regardless of variations in the positional accuracy and the radius of the laser beam.

Another object of the present invention is to provide an improved semiconductor device with a circuit including a fuse wiring capable of providing a higher degree of integration.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor device with a circuit including a fuse wiring which comprises a step portion provided on a first insulating film which is provided on a substrate; a fuse wiring provided on the step portion via a second insulating film so that the central portion of the fuse wiring traverses the step portion; the central portion of the fuse wiring being positioned at a higher position than the side portions thereof by the thickness of the step portion; and a third insulating film having a flat surface provided on the fuse wiring.

DETAILED DESCRIPTION OF THE PREFERRED EMBODIMENTS

In order to explain the present invention in detail, reference will be particularly made to FIG. 1.

In FIG. 1, there is provided a silicon substrate 1, and a field oxide film 2 is provided on the silicon substrate 1. There is also provided a first polysilicon gate 8 for providing a step of raised position on the field oxide film 2, and a thermal oxide film 9 is provided on the first polysilicon gate 8. A fuse for a redundancy circuit 3 is provided on the thermal oxide film 9 in a configuration having a step. This redundancy circuit fuse 3 may be produced with a polysilicon, a high melting point metal or a high melting point metal silicide. A phosphorus silicate glass (PSG) film or boron phosphorus silicate glass (BPSG) film 4 is provided on the fuse for a redundancy circuit 3. This film 4 may be produced by BPSG (boron phosphorous silicate glass) or silicon dioxide.

The process for producing the redundancy circuit of a semiconductor device of this embodiment will be described with reference to FIGS. 1(a) to (f).

First of all, a field oxide film 2 is produced on a silicon substrate 1, and a first layer polysilicon gate is produced thereon at an element production region (not shown) on the silicon substrate 1, and at the same time a polysilicon gate 8 having a width l2 is produced on the field oxide film 2 at a redundancy circuit production region. Subsequently, the entire silicon substrate 1 is thermally oxidized thereby to produce a thermal oxide film 9 on the surface of the field oxide film 2 at the above-mentioned element production region, and at the same time a thermal oxide film 9 is produced over the surface of the first polysilicon gate 8 at the redundancy circuit production region (refer to FIG. 1(a)). Then, a second polysilicon gate (not shown) is produced over the thermal oxide film 9 at the element production region, and at the same time a fuse for a redundancy circuit 3 is produced in a configuration having a step caused by the first polysilicon gate 8 at the redundancy circuit production region. Subsequently, a PSG film 4 is produced by a CVD method over the fuse 3 and the thermally oxide film 9 (refer to FIG. 1(c)). Thereafter, a photoresist 10 is wrapped over the whole surface of the PSG film 4, and the PSG film 4 and the photoresist 10 are etched by an etching solution which exhibits the same etching speed against the PSG film 4 and the photoresist 10. Thus, the surface of the PSG film 4 is made flat, and the thickness of the PSG film 4 on the fuse 3 becomes t0 at the central portion of the fuse 3 and t1 at the both side portions thereof (refer to FIG. 1(e)). Subsequently, contact holes such as 5A and 5B are apertured on the silicon substrate 1 (not shown), on the first silicon gate (not shown), and on the second silicon gate at the element production region, and at the same time contact holes 5A and 5B are apertured on the redundancy circuit (not shown) fuse 3 using a photoresist mask at the redundancy circuit production region (refer to FIG. 1(f)). Thereafter, the photoresist film is removed, and an aluminum wiring 6 is provided, thereby to produce a semiconductor device including a redundancy circuit having the redundancy circuit fuse 3 in addition to the element at the element production region. FIG. 1(h) shows a completed device.

Figure 1H:
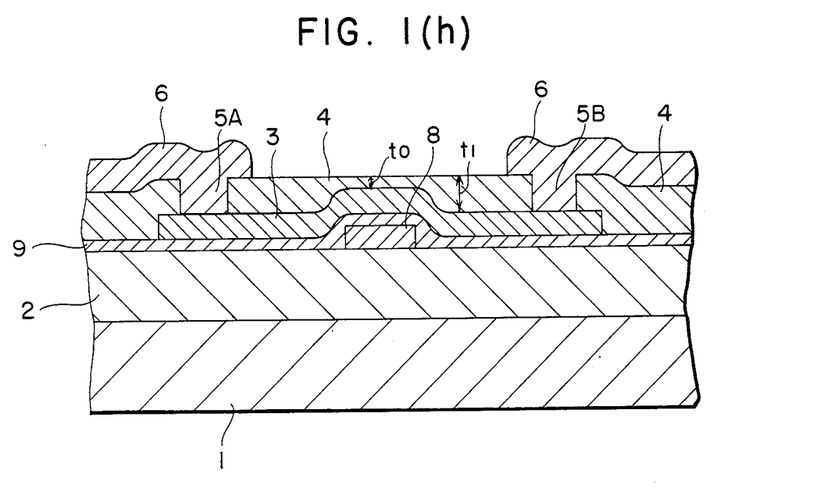
FIG. 1(h) is a cross-sectional view of FIG. 1(g) in lines B to B.
Figure 2:
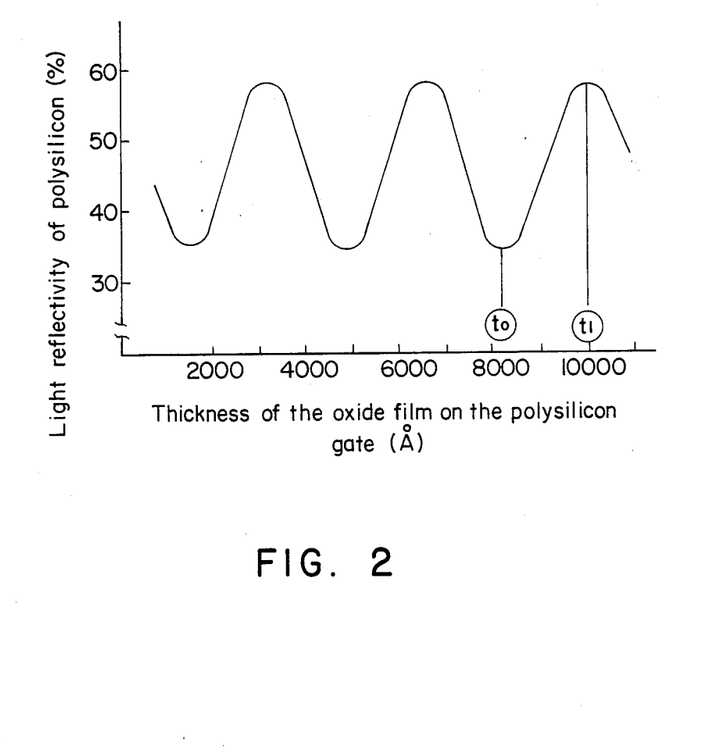
FIG. 2 is a diagram showing the characteristics of the light reflectivity of polysilicon vs. the thickness of a silicon dioxide film.

The light reflectivity of the polysilicon surface overlapped by a silicon oxide film varies dependent on the thickness of the silicon dioxide film on the polysilicon gate as shown in FIG. 2. If the film thickness t0 and t1 of the PSG film 4 on the fuse 3 shown in FIG. 1(h) correspond to t0 and t1 in FIG. 2, the light reflectivity at that portion of the surface of the redundancy circuit fuse 3 where the thickness of the PSG film 4 is t0 becomes 30%, and the remaining 70% of the incident light is absorbed by the fuse 3. On the other hand, the light reflectivity at that portion where the thickness of the PSG film 4 is t1 becomes 60%, and the remaining 40% is absorbed by the fuse 3. Similar phenomena also occur when the incident light is a laser beam.

Figure 1A:
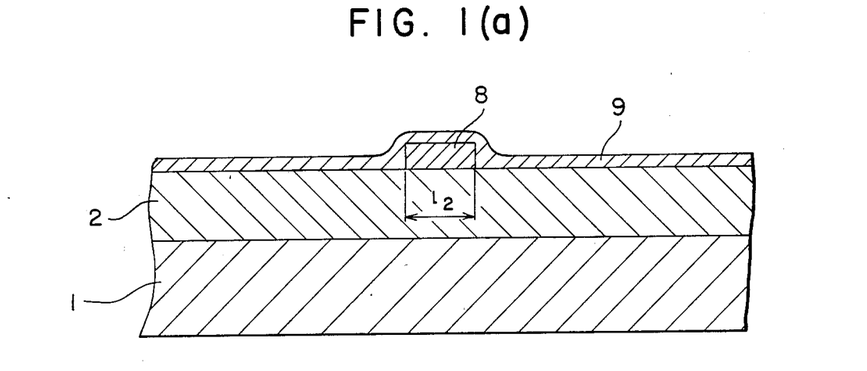
FIGS. 1(a) to (f) are cross-sectional views for illustrating a process of manufacturing a fuse for a redundancy circuit of a semiconductor device as an embodiment of the present invention.
Figure 1B:
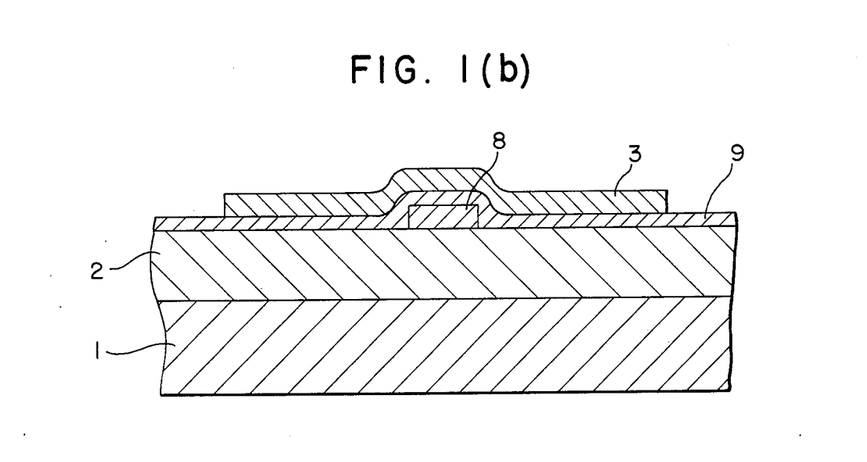
Figure 1C:
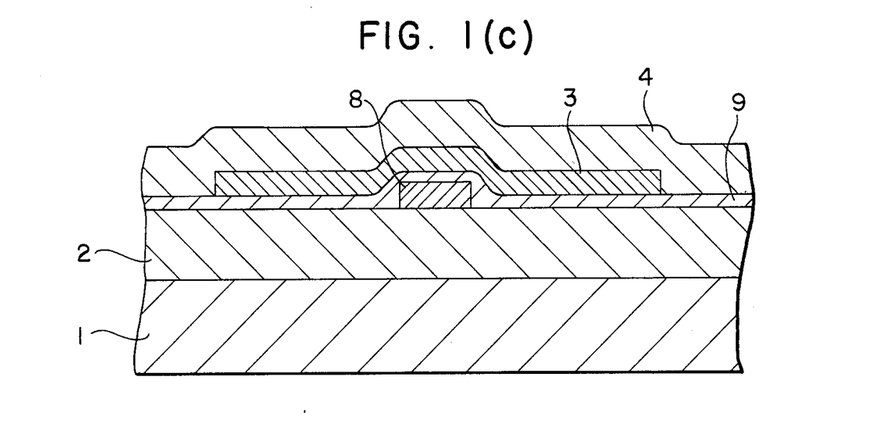
Figure 1D:
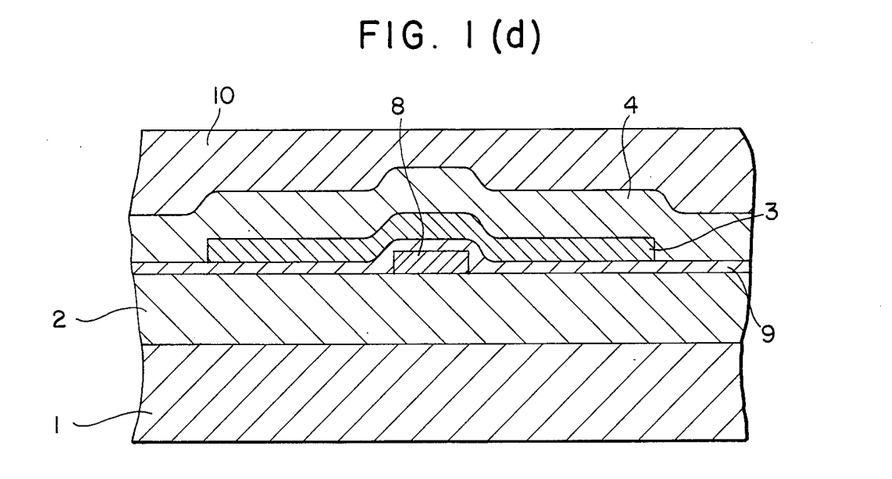
Figure 1E:
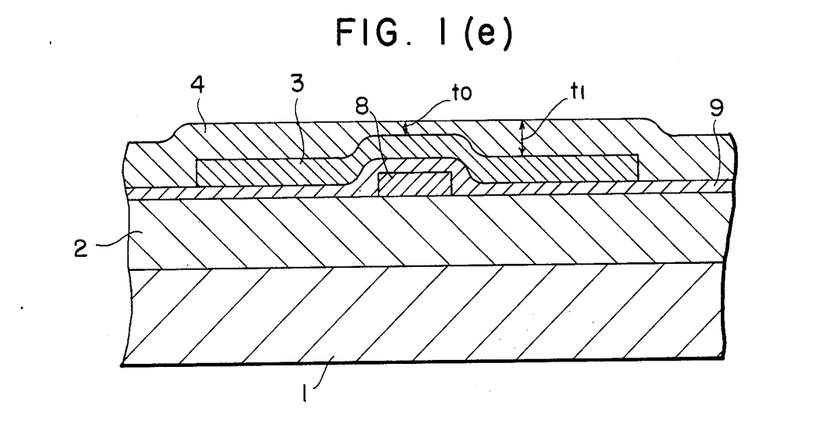
Figure 1F:
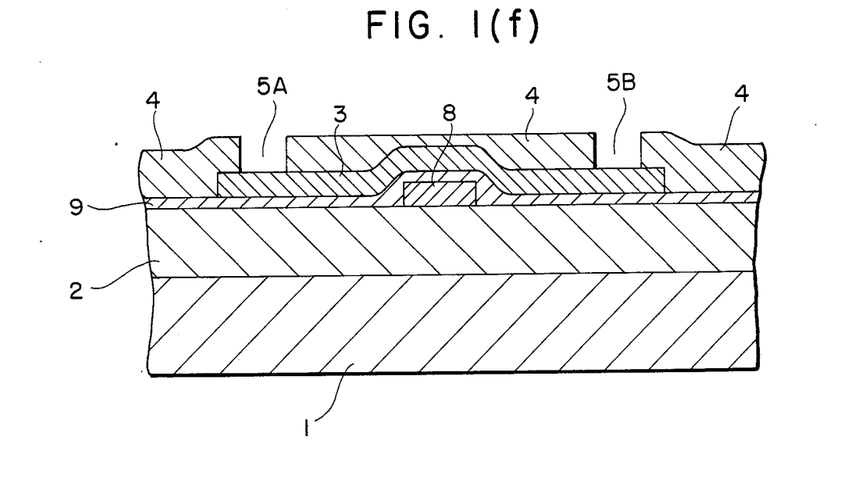
Figure 1G:
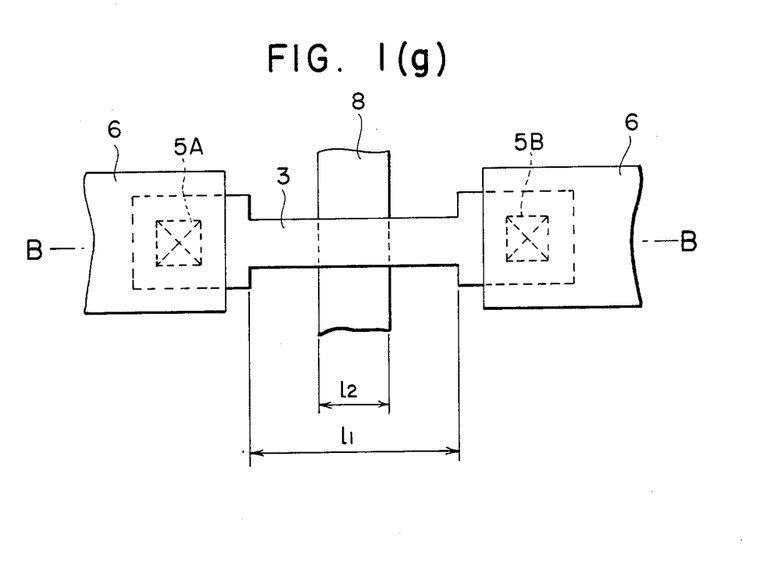
FIG. 1(g) is a plan view showing the redundancy circuit of the above embodiment.
Figure 3A:
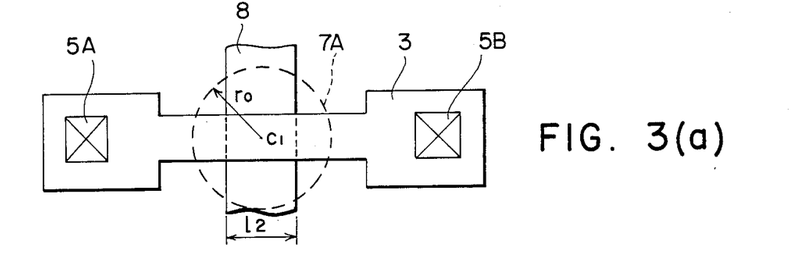
FIGS. 3(a) to (d) are diagrams showing a state where a laser beam is irradiated to the redundancy circuit fuse of an embodiment of the present invention.
Figure 3B:
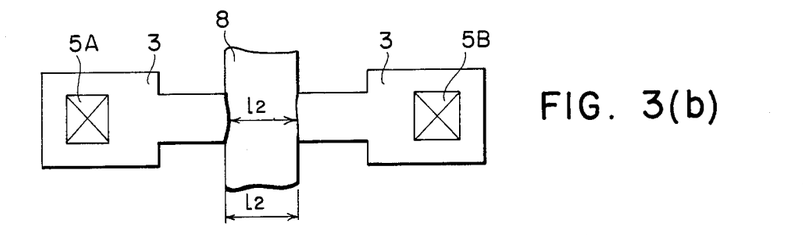
Figure 3C:
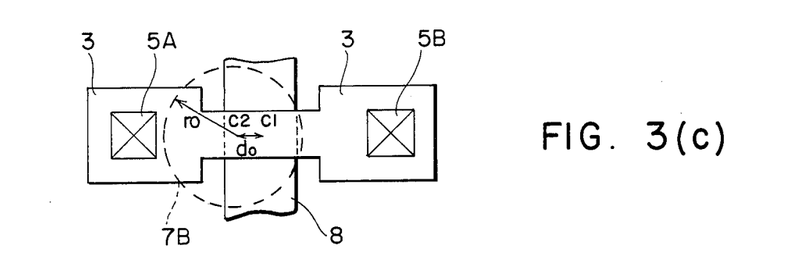

FIG. 3(a) shows a state where the laser beam 7A having a radius r0 is irradiated to the center C1 of the redundancy circuit fuse 3 shown in FIG. 1(g). In this case, the thickness t0, t1 of the PSG film 4 on the redundancy circuit fuse 3 are designed to make the light reflectivity about 30% and 40%, respectively, and the energy of the laser beam 7A is set at an appropriate value. The redundancy circuit fuse 3 at the region of PSG film thickness t0 is melted regardless of the radius r0 of the laser beam 7A as shown in FIG. 3(b), and it is cut off along the width L2. This width L2 is approximately equal to the width l2 of the first polysilicon gate 8, and it does not depend on the radius r0 of the laser beam 7A at all.

Figure 3D:
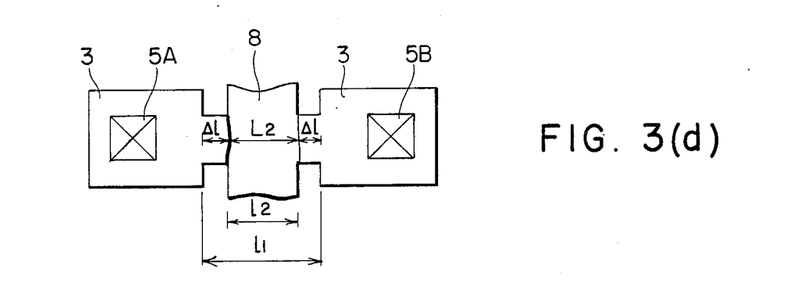

Furthermore, the portion to be melted is restricted to the region where the PSG film thickness is t0 even when the laser beam 7B is irradiated to the position C2 which is apart from the center C1 of the fuse 3 by a distance d0 (refer to FIG. 3(d)). That is, it does not depend on the positional accuracy of the laser beam 7A.

Accordingly, the cut off region length l1 of the redundancy circuit fuse 3 is represented by the following formula using the width l2 of the first polysilicon gate 8 and the mask alignment margin Δl between the first polysilicon gate and the second polysilicon gate (refer to FIG. 3(d)).

$$l1 = l2 + 2\Delta l \tag{1-6}$$

In photolithographic techniques at present, it is secured that l2=1.5 μm, Δl=0.5 μm, and accordingly $$l1 \geq l2 + 2\Delta l = 2.5 \ \mu m \tag{1-7}$$

It is apparent that the length of the fuse is reduced by 4.5 μm as compared with the length 7 μm in the prior art device which is represented by the formula (1-5). This reduction in the cut off region length L1 permits the providing a higher degree of integration in LSIs.

As is evident from the foregoing description, according to the present invention, the thickness of the insulating film on the redundancy circuit fuse varies dependent on its position, and it permits the cutting off of the redundancy circuit fuse along a constant length regardless of the radius and the positional accuracy of the laser beam. This allows for reducing the length of the redundancy circuit fuse, thereby providing a higher degree of integration in LSIs.

What is claimed is:

1. A semiconductor device in a circuit which comprises:

step means provided on a a first insulating film, said first insulating film being provided on a substrate;

a fuse wiring provided on a second insulating film which is provided on said step means, wherein the central portion of said fuse wiring traverses said step means, said central portion of said fuse wiring being offset from the surrounding portions of said fuse wiring by a distance equal to the thickness of said step means; and a third insulating film having a flat surface provided on said fuse wiring, wherein the thickness of the central portion of said third insulating film which traverses said central portion of said step means is less than the thickness of the surrounding portions of said third insulating film.

2. The semiconductor device of claim 1, wherein only the central portion of the fuse wiring is capable of being melted by laser beam irradiation.

3. The semiconductor device of claim 1, wherein the third insulating film comprises a phosphorus silicate glass (PSG) film, a boron phosphorus silicate glass (BPSG) film, or a silicon dioxide film, and wherein the fuse wiring comprises a polysilicon, a high melting point metal, or a high melting point metal silicide.

4. The semiconductor device of claim 2, wherein said third insulating film comprises a phosphorus silicate glass (PSG) film, a boron phosphorus silicate glass (BPSG) film, or a silicon dioxide film, and wherein said fuse wiring comprises a polysilicon, a high melting point metal, or a high melting point metal silicide.

5. The semiconductor device of claim 2, wherein the step means comprises a polysilicon gate, the second insulating film comprises a thermal oxide film, the first insulating film comprises a field film, and the substrate comprises silicon.

6. The semiconductor device of claim 3, wherein the step means comprises a polysilicon gate, the second insulating film comprises a thermal oxide film, the first insulating film comprises a field film, and the substrate comprises silicon.

7. The semiconductor device of claim 2, further comprising circuit wiring which is operatively associated with the fuse wiring via contact holes formed through the third insulating film.

8. The semiconductor device of claim 3, further comprising circuit wiring which is operatively associated with the fuse wiring via contact holes formed through the third insulating film.

* * * * *